(12) United States Patent
Bjork et al.

(10) Patent No.: US 7,561,424 B2
(45) Date of Patent: Jul. 14, 2009

(54) METHOD FOR COOLING ELECTRONIC COMPONENTS IN AN UNMANNED FLYING VEHICLE AND A DEVICE FOR CARRYING OUT THE METHOD

(75) Inventors: Hakan Bjork, Ljungsbro (SE); Karl-Johan Molin, Linkoping (SE); Lars Olsson, Linkoping (SE)

(73) Assignee: Saab AB, Linköping (SE)

( * ) Notice: Subject to any disclaimer, the term of this patent is extended or adjusted under 35 U.S.C. 154(b) by 149 days.

(21) Appl. No.: 11/162,956

(22) Filed: Sep. 29, 2005

(65) Prior Publication Data

US 2006/0250775 A1    Nov. 9, 2006

(30) Foreign Application Priority Data

Sep. 30, 2004    (EP)    ................................... 04023324

(51) Int. Cl.
*H05K 7/20*    (2006.01)
(52) U.S. Cl. ........................ 361/699; 361/700; 165/80.4
(58) Field of Classification Search ........................ None
See application file for complete search history.

(56) References Cited

U.S. PATENT DOCUMENTS

| | | | |
|---|---|---|---|
| 4,922,381 A | 5/1990 | Longerich et al. | |
| 5,515,910 A * | 5/1996 | Hamilton et al. | ............ 165/263 |
| 6,139,361 A * | 10/2000 | Przilas et al. | ................ 439/559 |
| 6,498,725 B2 * | 12/2002 | Cole et al. | ................... 361/700 |
| 6,595,014 B2 * | 7/2003 | Malone et al. | ................ 62/171 |
| 6,625,023 B1 * | 9/2003 | Morrow et al. | ............... 361/700 |
| 6,880,350 B2 * | 4/2005 | Tilton | .......................... 62/171 |
| 6,953,082 B2 * | 10/2005 | Costello et al. | ............ 165/80.4 |
| 6,955,063 B2 * | 10/2005 | Adiga et al. | ................ 62/259.2 |
| 6,971,441 B2 * | 12/2005 | Lee | ........................ 165/104.22 |
| 6,976,528 B1 * | 12/2005 | Tilton et al. | ............ 165/104.33 |
| 6,996,996 B1 * | 2/2006 | Cader | ........................... 62/118 |
| 7,082,778 B2 * | 8/2006 | Patel et al. | .................. 62/259.2 |
| 7,264,042 B1 * | 9/2007 | Tilton et al. | ............ 165/104.33 |
| 2003/0047103 A1 | 3/2003 | Rabin et al. | |
| 2004/0123975 A1 | 7/2004 | Lee | |
| 2007/0183126 A1 * | 8/2007 | Tilton et al. | .................. 361/699 |

FOREIGN PATENT DOCUMENTS

GB    837022 A    6/1960

OTHER PUBLICATIONS

Patent abstracts of Japan, vol. 017, No. 479 (M-1471), Aug. 31, 1993 & JP 05 113299 A (Mitsubishi Electric Corp), May 7, 1993.

* cited by examiner

*Primary Examiner*—Boris L Chervinsky
(74) *Attorney, Agent, or Firm*—Venable LLP; Eric J. Franklin

(57) ABSTRACT

A device for cooling electronic components of a control unit in an unmanned flying vehicle. A container contains a liquid cooling medium. A temperature sensor is adapted to sense the temperature of the electronic components during the flight of the vehicle. A sprayer adapted to be controlled by the temperature sensor to spray the liquid cooling medium directly upon the electronic components when the temperature of the cooling medium exceeds a predetermined level.

24 Claims, 1 Drawing Sheet

METHOD FOR COOLING ELECTRONIC COMPONENTS IN AN UNMANNED FLYING VEHICLE AND A DEVICE FOR CARRYING OUT THE METHOD

FIELD OF THE INVENTION

The present invention relates to a method for cooling electronic components of a control unit in an unmanned flying vehicle as well as a device for carrying out such a method.

BACKGROUND OF THE INVENTION

Unmanned flying vehicles typically have control units with electronic components for the control of the behaviour of the vehicle. Examples of such vehicles are high speed missiles, air-to-air missiles, especially homing missiles needing a control unit for finding a target. The term "control unit" referred to herein may also include sensors and other type of equipment of such a vehicle having electronic components.

The invention is particularly applicable to high speed vehicles, since the cooling problem is more accentuated for such vehicles. However, the invention is not restricted thereto. Such high speed flying vehicles, such as high speed air-to-air missiles, are heated substantially during the flight thereof through aerodynamic resistance. This heating is combined with a heat generation by the electronic components themselves, so that these components will in absence of cooling measures quickly arrive to temperatures exceeding the acceptable operation temperatures of these components. Furthermore, there is a continuous aim of miniaturising such control units and the electronic components thereof for each new generation of such equipment, and the power consumption thereof is continuously increasing. This makes it very important to be able to efficiently cool these electronic components, especially since there is a desire to use so-called industry tempered components being much less costly than so-called military components but having a lower temperature resistance.

Cooling methods, active as well as passive, are known.

A passive method is known through US 2003/0047103 A1, in which a heat sink is used for draining heat from the electronic components.

Active methods using cooling by the circulation of gas are also known.

A disadvantage of these known methods is that they require a cold surface or mass for functioning. This makes it impossible to use them in the high speed missiles now built, since they will not have any cold surface or mass for cooling purposes.

SUMMARY OF THE INVENTION

The object of the present invention is to provide a method and a device for cooling electronic components of a control unit in an unmanned flying vehicle, through which such cooling may be efficiently achieved also in such new types of missiles, but also in other unmanned flying vehicles mentioned in the introduction.

This object is according to the invention obtained by providing such a device with a container containing a liquid cooling medium, means adapted to sense the temperature of said electronic components during the flight of said vehicle and means adapted to be controlled by said temperature sensing means to spray said liquid cooling medium directly upon said electronic components when the temperature exceeds a predetermined level, as well as a method according to the appended independent method claim.

By spraying such a liquid cooling medium directly upon the electronic components only when this is necessary, i.e. when the temperature thereof reaches a certain level, cooling may efficiently be achieved without any necessity to have any cold surfaces. The cooling medium used does not have to be recycled and may be considered as waste.

This solution results in a low volume and a low weight for such a device. A high cooling effect may be obtained in a very short time, and it may be ensured that higher power loads may be removed or at least reduced. It is also advantageous that the cooling device is in this way integrated with the electronic components.

It is pointed out that "sense the temperature" and "when the temperature thereof exceeds a predetermined level" are to be interpreted broadly, and the temperature of the electronic components may be sensed indirectly, for instance by sensing the temperature of a circuit board or the like onto which the components are arranged or even measuring any type of power dissipation or consumption, which is known to have a certain relation to the temperature of the electronic components. This also means that said predetermined temperature level may be determined in the same indirect way.

A use of this cooling technique, i.e. cooling by spraying a liquid cooling medium upon the electronic components, has until now been considered to be impossible for these types of flying vehicles, since a continuous spraying requires cooling surfaces for cooling the liquid heated and possibly evaporated for recycling thereof. This is not possible to obtain for air-to-air missiles, especially of the generation of today. Thus, the present invention enables the utilisation of this favourable method previously considered to be no option by spraying the liquid cooling medium only when it is necessary and directly upon the electric components.

According to an embodiment of the present invention said spraying means is adapted to spray said liquid cooling medium upon said electronic components as long as the temperature thereof exceeds said predetermined level. This means that it is ensured that the electronic components will not be damaged as a consequence of too high temperatures thereof and said liquid cooling medium will not be wasted by spraying it when it is not needed, so that the container with liquid cooling medium may have a low weight.

According to another embodiment of the invention the container contains a liquid cooling medium having a boiling temperature close to said predetermined temperature level for removing heat energy from the electronic components by evaporation of said cooling medium. It is very advantageous to select a cooling medium with such a boiling temperature, since the cooling, i.e. removal of heat energy, will be very efficient when the liquid cooling medium is evaporated at the same time as the temperature thereof is then not rising.

According to another embodiment of the invention said container is adapted to contain a liquid cooling medium having a boiling temperature above said predetermined temperature level, preferably 1° C.-5° C. above said predetermined temperature level. It has been found that the cooling will be very efficient if the liquid cooling medium sprayed upon the electronic components will be heated slightly above said predetermined temperature level and then start to evaporate for cooling the components.

According to another embodiment of the invention said electronic components are so-called industry tempered components, and said spraying means has a predetermined temperature level being below 90° C., preferably below 70° C. and preferably above 60° C. It has turned out that it is possible to use such industry tempered components as a consequence of the efficiency of the cooling method according to the invention. This results in a considerable saving of costs with respect to the use of so-called military components able to withstand temperatures up to 120° C. or more.

According to another embodiment of the invention said container is adapted to contain a liquid cooling medium being dielectrical. This is advantageous and sometimes a requirement, namely when it may not be avoided that the cooling medium comes on surfaces of a printed circuit card and would otherwise create short-circuits between conducting paths thereon.

According to another embodiment of the invention the container is adapted to contain a liquid cooling medium in the form of a liquid fluor carbonate, which has turned out to be favourable with respect to cooling capacity as well as boiling temperature.

According to another embodiment of the invention a container is adapted to contain a pressurised liquid cooling medium, which makes it possible to efficiently spray the cooling medium upon the electronic components and especially atomize said medium for spraying it so as to form a finely distributed film thereof on top of said electronic components, which constitutes another embodiment of the present invention. Such spraying results in an excellent utilisation of the cooling capacity of the liquid cooling medium avoiding any unnecessary waste of cooling medium not utilised for the cooling task.

According to another embodiment of the invention said spraying means is adapted to spray said liquid cooling medium upon said electronic components so that bubbles of a predetermined size are formed in said film for promoting heat energy removal from said electronic components by evaporation of the liquid cooling medium. It has turned out that the formation of such bubbles, which may have a size depending upon which cooling medium is used, promotes said heat energy removal, so that the cooling medium used may be efficiently utilised.

According to another embodiment of the invention the device is adapted to be used only once, i.e. only during one flight of said flying vehicle, which is the most favourable use of a device according to the invention, since in such a case less consideration has to be spent upon what happens with the liquid cooling medium after fulfilling the cooling task. It is particularly advantageous to arrange the device in a once-flying vehicle, such as in a high speed missile.

According to another embodiment of the invention said container and said electronic components are integrated into a closed box in said flying vehicle, which means that the liquid cooling medium will stay inside said box making the cooling action thereof more efficient and avoiding that it comes into contact with other parts of the flying vehicle.

The invention also relates to a method for cooling electronic components of a control unit in an unmanned flying vehicle according to the different embodiments thereof defined in the appended claims, and the function and the advantages thereof appear clearly from the above description of the devices according to the different embodiments of the present invention.

Further advantages as well as advantageous features of the invention will appear from the following description as well as the other dependent claims.

BRIEF DESCRIPTION OF THE DRAWINGS

With reference to the appended drawing, below follows a specific description of a method and a device according to an embodiment of the present invention. In the drawing.

DETAILED DESCRIPTION OF THE INVENTION

Figure 1:
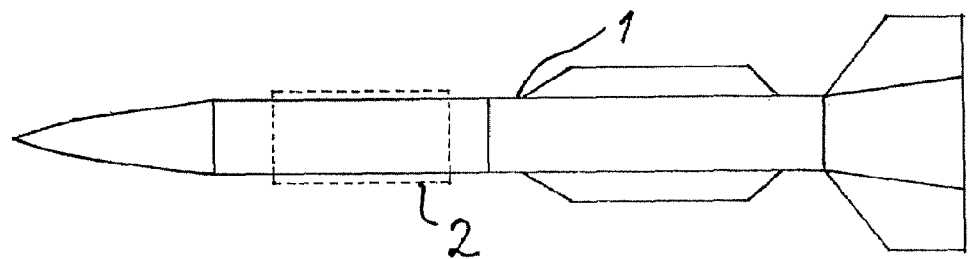
FIG. 1 is a schematic view illustrating a flying vehicle in the form of a high speed air-to-air missile to which the present invention is applied.
Figure 2:
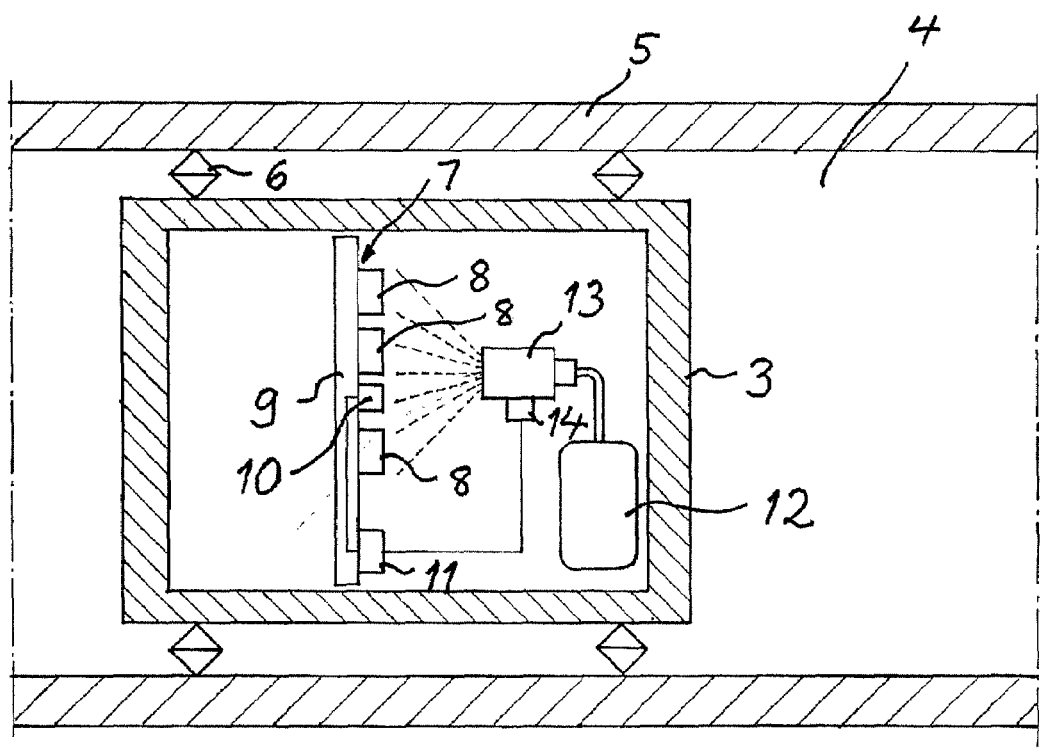
FIG. 2 is a partially sectioned and simplified view of a detail of the missile according to FIG. 1 illustrating an embodiment of the present invention.

A high speed missile 1 having a cooling device according to the invention is schematically shown in FIG. 1. The part within the box 2 of dashed lines is shown in FIG. 2. It is pointed out that FIG. 2 is a very simplified view used for illustrating the principle of a device and a method according to an embodiment of the present invention.

A so-called electronic box 3 is arranged within the inner volume 4 of the missile shell 5 and connected thereto through suitable connecting members 6 preferably of a heat insulating material, so that there is a distance between the shell 5 and the box 3 for reducing transfer of heat energy from the shell 5 to the box as a result of the aerodynamic resistance experienced by the missile during the high speed flight.

The box 3 contains a control unit 7 used for the control of the missile and having for that sake a number of electronic components 8 arranged on a printed circuit card 9. The control unit may be connected to different control means, such as means driving the missile, but such connections are not shown here, since they have nothing to do with the present invention.

A means 10 adapted to measure the temperature of the electronic components by measuring the temperature close thereto such as of the printed circuit card, is arranged on the printed circuit card and adapted to send information about this measurement to a control member 11. The box 3 further contains a container 12 containing a pressurised liquid cooling medium and being connected to means 13 in the form of a nozzle for spraying this liquid cooling medium upon said electronic components when controlled to do that through said control member 11. The nozzle 13 has a member 14, which may be controlled through said control member 11 to influence the spraying of said spraying means by controlling the degree thereof and/or the nature thereof.

The control member 11 is adapted to control the member 14 and by that the spraying means 13 to start spraying cooling medium directly upon the electronic components 8 when the temperature measuring means 10 indicates that the temperature of the electronic components exceeds a predetermined level. This level is determined while considering the temperature acceptable to the electronic components without failure or damage thereof. In the case of so-called industry tempered electronic components this temperature level is preferably below 90° C. and preferred in the region of 70° C.

The spraying means 13 may be adapted to spray liquid cooling medium upon the electronic components as long as the means 10 indicates that the temperature of these components exceeds said predetermined level.

The spraying means 13 is further adapted to atomize the liquid cooling medium for spraying it so as to form a finely distributed film thereof on top of the electronic components, and the spraying is preferably carried out so that bubbles of a predetermined size, such as in the order of millimetres, are formed in said film for promoting heat energy removal from said electronic components by evaporation of the liquid cooling medium. The spraying means does preferably create a "cloud" of cooling medium substantially uniformly distributed over the electronic components.

Said predetermined temperature level is preferably adapted to the boiling temperature of the liquid cooling medium used, so that this level is close to said boiling temperature and preferably just below said boiling temperature, preferably 1° C.-5° C. below this temperature. Liquid fluor carbonate is a preferred liquid cooling medium to be used having a suitable boiling temperature and being dielectrical avoiding any risk of short-circuits.

As already mentioned, the present invention is particularly applicable to cooling of electronic components in missiles experiencing a high heat generation during use, from the heating through the function of the electronic components and/or from external sources, such as aerodynamic heating. It is especially a question of a use of the spray cooling technique in once-flying vehicles, such as high speed missiles.

The invention is of course not restricted to the embodiment described above, but many possibilities to modifications thereof would be apparent to a person with ordinary skill in the art without departing from the basic idea of the invention as defined in the appended claims.

The container containing the liquid cooling medium may be arranged outside the electronic box, although it may be preferred to have it inside the electronic box.

More than one container and/or spraying means may be arranged in the same flying vehicle.

What is claimed is:

1. A method for cooling electronic components of a control unit in an unmanned flying vehicle, the method comprising:
   providing a cooling device in the unmanned flying vehicle, the cooling device comprising a temperature measurer configured to measure a temperature of the electronic components, a sprayer configured to spray liquid cooling medium, a container containing the liquid cooling medium and an enclosure containing the electronic components, the temperature measurer, the sprayer and the container, the enclosure comprising a closed box in said flying vehicle, wherein said container and said electronic components are integrated into the closed box,
   measuring a temperature of the electronic components with the temperature measurer,
   spraying a liquid cooling medium from the container directly upon said electronic components with the sprayer when the temperature of the electronic components exceeds a predetermined level, wherein the liquid cooling medium has a boiling temperature close to said predetermined temperature level, wherein the liquid cooling medium is sprayed directly upon the electronic components for removing heat energy from the electronic components by evaporation of said cooling medium,
   connecting the enclosure to the unmanned flying vehicle with connecting members, wherein the connecting members connect the enclosure at a distance to a fuselage of the unmanned flying vehicle, and
   adapting the device to be arranged in a single-use flying vehicle.

2. The method according to claim 1, wherein said liquid cooling medium is sprayed directly upon said electronic components as long as the temperature of the electronic components exceeds said predetermined level.

3. The method according to claim 1, wherein the liquid cooling medium has a boiling temperature above said predetermined temperature level.

4. The method according to claim 1, wherein the liquid cooling medium comprises a dielectric liquid cooling medium.

5. The method according to claim 1, wherein said liquid cooling medium is atomized when sprayed directly upon said electronic components for forming a finely distributed film of said liquid cooling medium directly on top of said components.

6. The method according to claim 5, wherein said liquid cooling medium is sprayed directly upon said electronic components so that bubbles of a predetermined size are formed in said film for promoting heat energy removal from said electronic components by evaporation of the liquid cooling medium.

7. The method according to claim 3, wherein the liquid cooling medium has a boiling temperature 1° C.-5° C. above said predetermined temperature level.

8. A device for cooling electronic components of a control unit in an unmanned flying vehicle, comprising:
   a container containing a liquid cooling medium,
   temperature sensor adapted to sense a temperature of said electronic components during flight of said vehicle,
   a sprayer adapted to be controlled by said temperature sensor to spray said liquid cooling medium directly upon said electronic components when the temperature of the electronic components exceeds a predetermined level, wherein the liquid cooling medium has a boiling temperature close to said predetermined temperature level for removing heat energy from the electronic components by evaporation of said cooling medium,
   an enclosure in which the electronic components, the container, the temperature sensing means, and the sprayer are arranged, the enclosure comprising a closed box arranged in said flying vehicle, wherein said container and said electronic components are integrated into the closed box, and
   connecting members configured to connect the enclosure to the unmanned flying vehicle, wherein the connecting member connect the enclosure to the unmanned flying vehicle at a distance from a fuselage of the unmanned flying vehicle,
   wherein the device is adapted to be arranged in a single-use flying vehicle.

9. The device according to claim 8, wherein said sprayer is adapted to spray said liquid cooling medium directly upon said electronic components as long as the temperature of the electronic components exceeds said predetermined level.

10. The device according to claim 8, wherein said liquid cooling medium has a boiling temperature above said predetermined temperature level.

11. The device according to claim 8, wherein said electronic components are industry tempered components, and wherein said predetermined temperature level is below 90° C.

12. The device according to claim 8, wherein said liquid cooling medium comprises a dielectric cooling medium.

13. The device according to claim 8, wherein said liquid cooling medium comprises a liquid fluor carbonate.

14. The device according to claim 8, wherein said liquid cooling medium is pressurised within said container.

15. The device according to claim 8, wherein said sprayer is adapted to atomize said liquid cooling medium for spraying said liquid cooling medium so as to form a finely distributed film of the liquid cooling medium directly on top of said electronic components.

16. The device according to claim 15, wherein said sprayer is adapted to spray said liquid cooling medium directly upon said electronic components so that bubbles of a predetermined size are formed in said film for promoting heat energy removal from said electronic components by evaporation of the liquid cooling medium.

17. The device according to claim 8, wherein the device is adapted to be used only once.

18. A method of using a device according to claim 8 for cooling electronic components of a control unit in an unmanned flying vehicle including high speed missiles and air-to-air missiles.

19. The device according to claim 10, wherein said liquid cooling medium has a boiling temperature 1° C.-5° C. above said predetermined temperature level.

20. The device according to claim 11, wherein said predetermined temperature level is below 70° C.

21. The device according to claim 11, wherein said predetermined temperature level is above 60° C.

22. The device according to claim 17, wherein the device is adapted to be used only during one flight of said flying vehicle.

23. The device according to claim 17, wherein the device is adapted to be arranged in a high speed missile.

24. An unmanned flying vehicle, comprising:
a fuselage;
a electronic components arranged within the fuselage;
a container arranged within the fuselage and containing a liquid cooling medium;
a temperature sensor arranged within the fuselage and configured to sense a temperature of the electronic components during flight of the vehicle;
a sprayer arranged within the fuselage and controlled by the temperature sensor to spray the liquid cooling medium directly upon the electronic components when the temperature of the electronic components exceeds a predetermined level, wherein the liquid cooling medium has a boiling temperature close to said predetermined temperature level, wherein the liquid cooling medium is sprayed directly upon the electronic components for removing heat energy from the electronic components by evaporation of said cooling medium; and
an enclosure arranged within the fuselage and enclosing at least the control unit, the temperature sensor and the sprayer, the enclosure comprising a closed box arranged in said flying vehicle, wherein said container and said electronic components are integrated into the closed box; and
connecting members configured to connect the enclosure to the fuselage at a distance from the fuselage to reduce heat transfer between the fuselage and the enclosure
wherein said unmanned flying vehicle is a single-use flying vehicle.

* * * * *